United States Patent
Song (10) Patent No.: US 6,996,019 B2
(45) Date of Patent: Feb. 7, 2006

(54) SEMICONDUCTOR DEVICE HAVING SENSE AMPLIFIER DRIVER THAT CONTROLS ENABLING TIMING

(75) Inventor: Tae-joong Song, Gyeonggi-do (KR)

(73) Assignee: Samsung Electronics, Co., Ltd., (KR)

(*) Notice: Subject to any disclaimer, the term of this patent is extended or adjusted under 35 U.S.C. 154(b) by 0 days.

(21) Appl. No.: 10/972,855

(22) Filed: Oct. 25, 2004

(65) Prior Publication Data

US 2005/0122812 A1   Jun. 9, 2005

(30) Foreign Application Priority Data

Dec. 4, 2003   (KR) .................... 10-2003-0087474

(51) Int. Cl.
*G11C 7/00* (2006.01)
(52) U.S. Cl. .................. 365/205; 365/210; 365/230.06
(58) Field of Classification Search ................ 365/205, 365/207, 210, 230.06, 189.07
See application file for complete search history.

(56) References Cited

U.S. PATENT DOCUMENTS 6,052,324 A * 4/2000 Tobita ...................... 365/207
6,717,842 B2 * 4/2004 Watanabe et al. ........... 365/154
6,804,153 B2 * 10/2004 Yoshizawa et al. ...... 365/189.07

FOREIGN PATENT DOCUMENTS

| JP | 9-259590 | 10/1997 |
| KR | 10-232895 | 9/1999 |
| KR | 02-55160 | 7/2002 |

\* cited by examiner

*Primary Examiner*—Gene N. Auduong
(74) *Attorney, Agent, or Firm*—Mills and Onello, LLP (57) ABSTRACT

Provided are a semiconductor device having a sense amplifier driver and a method of generating a sense amplifier enable signal for enabling a sense amplifier. The semiconductor device includes a sense amplifier, which is comprised of a plurality of inverters which are connected in series, a power supply circuit, and a discharge circuit. In this semiconductor device, an enabling timing of the sense amplifier enable signal is controlled by delaying a time taken to evaluate a first dummy bit line from a power supply voltage to a ground voltage using parasitic capacitance between the first dummy bit line and a first complementary dummy bit line. The method of generating the sense amplifier enable signal is performed using the above-described sense amplifier.

10 Claims, 8 Drawing Sheets

SEMICONDUCTOR DEVICE HAVING SENSE AMPLIFIER DRIVER THAT CONTROLS ENABLING TIMING

BACKGROUND OF THE INVENTION

This application claims the priority of Korean Patent Application No. 2003-87474, filed on Dec. 4, 2003, in the Korean Intellectual Property Office, the contents of which are incorporated herein in their entirety by reference.

1. Field of the Invention

The present invention relates to a semiconductor device, and more particularly, to a semiconductor device having a sense amplifier driver that can minimize the influence of an off current in high-temperature fast processes and a method of generating a sense amplifier enable signal while minimizing the influence of an off current.

2. Description of the Related Art

Figure 1:
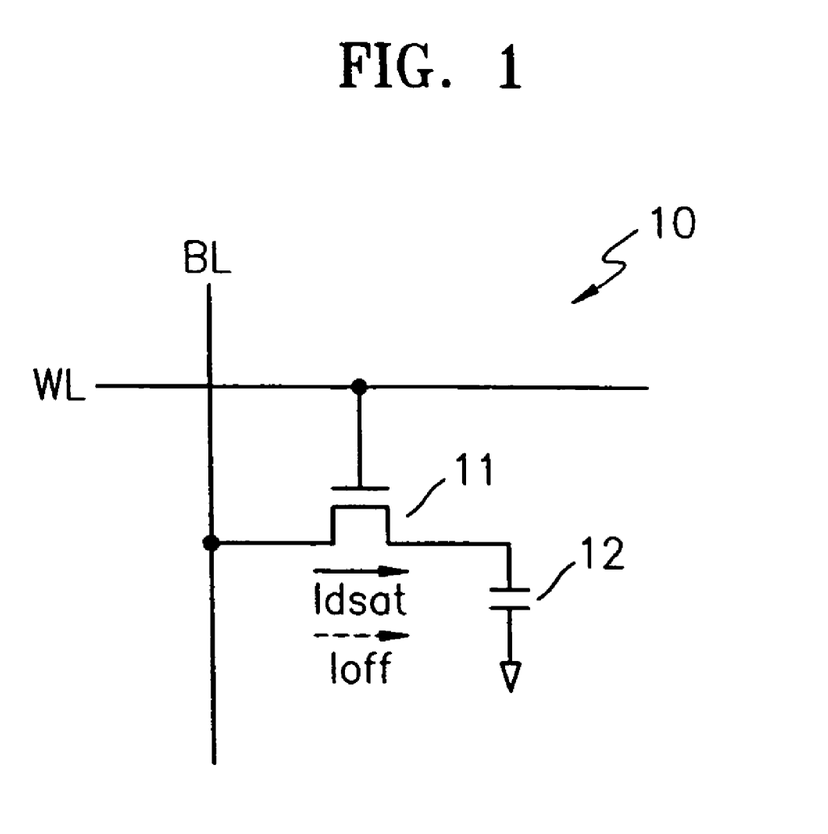
FIG. 1 is a conventional memory cell of a semiconductor memory device.

FIG. 1 is a schematic diagram of a conventional memory cell used for a semiconductor memory device. Referring to FIG. 1, the memory cell 10 is made up of a transistor 11 and a capacitor 12.

In general, the gate of the transistor 11 is connected to a word line WL, one node of the transistor 11 is connected to a bit line BL, and the capacitor 12, used to store data, is connected between the other node of the transistor 11 and the ground voltage VSS.

With the development of deep submicron technology, the threshold voltage of the transistor 11 is getting lower to improve performance of the transistor 11. The performance of the transistor 11 can be expressed by the amount of current Idsat that can flow through the transistor 11 at a turn-on state.

However, if the threshold voltage of the transistor 11 is lower, the amount of current Idsat that can flow through the transistor 11 at the turn-on state (hereinafter, on current) increases. Also, the amount of leakage current Ioff flowing through the transistor 11 at a turn-off state (hereinafter, off current) increases.

In general, the off current Ioff changes according to temperature, voltage, and a manufacturing process used in making the transistor. Processes include a fast process and a slow process. For example, a transistor in which the on current Idsat is large can be manufactured in the fast process, and a transistor in which the on current Idsat is small can be manufactured in the slow process.

However, under specific conditions (for example, a high temperature and fast process), the off current Ioff increases so much as to affect the on current Idsat. Particularly, in an array type with a plurality of memory cells, a merit obtained by lowering the threshold voltage of the memory cell dramatically decreases due to the difference between the on current Idsat and the off current Ioff in the high temperature and fast process.

When a memory device having a memory cell is designed, a limitation where threshold voltage of the memory cell can be lowered exists due to the off current.

SUMMARY OF THE INVENTION

The present invention provides a semiconductor device having a sense amplifier driver that minimizes or eliminates influence of off current. When the threshold voltage of a memory cell of the semiconductor device is reduced and thus the off current greatly increases, for example, during a high-temperature fast manufacturing process, the sense amplifier driver prevents the performance of the semiconductor device from being degraded due to the off current.

The present invention also provides a method of generating a sense amplifier enable signal while excluding influence of off current.

According to an aspect of the present invention, there is provided a semiconductor device comprising a sense amplifier which senses a voltage difference between a bit line and a complementary bit line; a dummy memory cell array which comprises a first dummy bit line and a first complementary dummy bit line; a second dummy bit line the voltage of which drops due to an off current; and a sense amplifier driver which buffers a clock signal and generates a sense amplifier enable signal for enabling the sense amplifier. The sense amplifier driver comprises a plurality of inverters which are connected in series; a first power supply circuit which supplies a power supply voltage to the first complementary dummy bit line based on the voltage of the second dummy bit line; and a discharge circuit which discharges the first complementary dummy bit line to a ground voltage in response to a complementary clock signal. At least a first inverter of the inverters generates a signal that swings between the voltage of the first dummy bit line and the ground voltage, and the second inverter inverts the output signal of the first inverter, an input terminal of the second inverter is connected to an output terminal of the first inverter, and an output terminal of the second inverter is connected to the first dummy bit line.

The second inverter can comprise a PMOS transistor which is connected between the power supply voltage and the first dummy bit line and has a gate that receives an input signal; and a plurality of NMOS transistors which are connected in series between the first dummy bit line and the ground voltage. The input signal can be input to a gate of each of the NMOS transistors.

The semiconductor device of the present invention can further comprise a second power supply voltage which is connected between the power supply voltage and the second dummy bit line and supplies the power supply voltage to the second dummy bit line based on the voltage of the second dummy bit line.

The semiconductor device can further comprise a third inverter which inverts the clock signal and outputs the result to an input terminal of the first inverter; and a third power supply circuit which supplies the power supply voltage to the output terminal of the second inverter in response to the clock signal.

According to another aspect of the present invention, there is provided a semiconductor device comprising a sense amplifier which senses a voltage difference between a bit line and a complementary bit line; a dummy memory cell array which comprises a first dummy bit line and a first complementary dummy bit line; a second dummy bit line the voltage of which drops due to an off current; and a sense amplifier driver which buffers a clock signal and generates a sense amplifier enable signal for enabling the sense amplifier. The sense amplifier driver comprises a plurality of inverters which are connected in series; a first power supply circuit which supplies a power supply voltage to the first complementary dummy bit line based on the voltage of the second dummy bit line; and a discharge circuit which discharges the second complementary dummy bit line to a ground voltage in response to a complementary clock signal. An output terminal of at least first inverter of the inverters is connected to the first dummy bit line. The first inverter comprises a pull-up circuit, which pulls up the first dummy bit line to the power supply voltage based on an input signal, and a pull-down circuit, which pulls down the first dummy bit line to the ground voltage based on the input signal and the voltage of the second dummy bit line.

The first inverter can comprise a PMOS transistor which is connected between the power supply voltage and the output terminal of the first inverter and has a gate that receives the input signal; an NMOS transistor which has a drain connected to the output terminal of the first inverter and a gate that receives the input signal; and a plurality of other NMOS transistors which are connected in series between a source of the NMOS transistor and the ground voltage. Herein, a gate of each of the plurality of other NMOS transistors can be connected to the second dummy bit line.

The semiconductor device of the present invention can further comprise a second power supply voltage which is connected between the power supply voltage and the second dummy bit line and supplies the power supply voltage to the second dummy bit line based on the voltage of the second dummy bit line.

In one embodiment, the first dummy bit line and the second dummy bit line are located in different memory cell arrays.

According to yet another aspect of the present invention, there is provided a method of generating a sense amplifier enable signal for enabling a sense amplifier. The method comprises a precharge step in which a first dummy bit line and a second dummy bit line are precharged to a power supply voltage and a first complementary dummy bit line is precharged to a ground voltage; and an evaluation step in which the first complementary dummy bit line is evaluated from the ground voltage to the power supply voltage and, concurrently, the first dummy bit line is evaluated from the power supply voltage to the ground voltage, based on the voltage of the second dummy bit line of which voltage drops due to an off current.

A time taken to evaluate the first dummy bit line from the power supply voltage to the ground voltage can be determined by the voltage of the second dummy bit line.

BRIEF DESCRIPTION OF THE DRAWINGS

The foregoing and other features and advantages of the invention will be apparent from the more particular description of an embodiment of the invention, as illustrated in the accompanying drawing. The drawing is not necessarily to scale, emphasis instead being placed upon illustrating the principles of the invention. Like reference characters refer to like elements throughout the drawings.

DETAILED DESCRIPTION OF THE INVENTION

Figure 2:
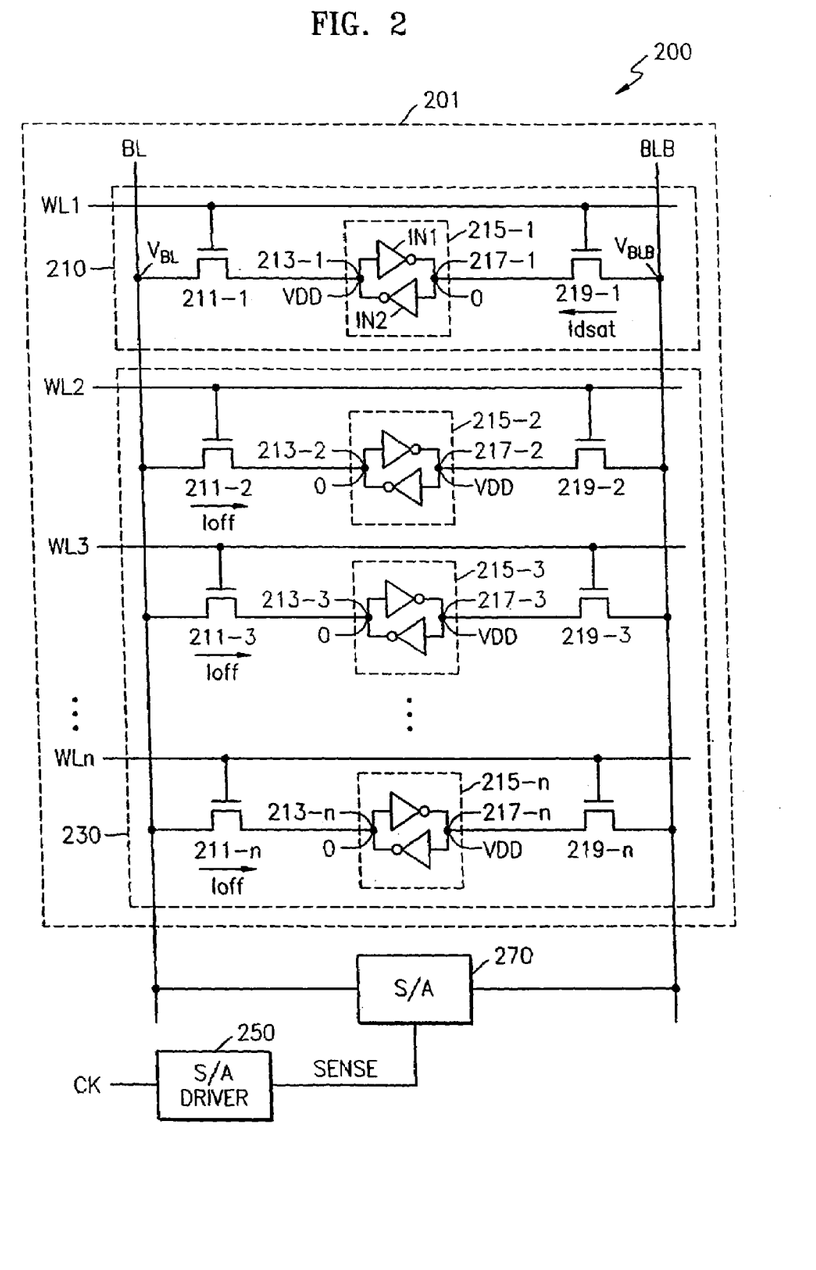
FIG. 2 is a block diagram of a semiconductor device having a conventional sense amplifier driver.

FIG. 2 is a block diagram of a semiconductor device 200 having a conventional sense amplifier driver. Referring to FIG. 2, the semiconductor device 200 includes a memory cell array 201, a sense amplifier driver 250, and a sense amplifier 270.

The memory cell array 201 includes a first memory block 210 and a second memory block 230. The memory cell array 201 includes a plurality of gating transistors 211-1, 211-2, ..., 211-n, 219-1, 219-2, ..., 219-n and a plurality of data storing circuits 215-1, 215-2, ..., 215-n, where n is a natural number.

The memory cell array 201 is a type most highly affected by off current in a row direction.

Each of data storing circuits 215-1, 215-2, ..., 215-n is realized by a latch made up of two inverters. Each inverter is realized by a complementary MOS (CMOS) inverter made up of one PMOS transistor and one NMOS transistor which are connected in series as well known in the semiconductor industry.

The sense amplifier driver 250 receives a clock signal CK and generates a sense amplifier enable signal SENSE in order to enable the sense amplifier 270 after predetermined time has passed.

The sense amplifier 270 senses voltage difference between a bit line BL and a complementary bit line BLB in response to the sense amplifier enable signal SENSE and amplifies the voltage difference.

For example, it is assumed that voltage $V_{BL}$ of the bit line BL and voltage $V_{BLB}$ of the complementary bit line BLB are precharged to power supply voltage VDD, respectively, each voltage of nodes 217-1, 213-2, 213-3, ..., 213-n is 0V, and each voltage of nodes 213-1, 217-2, 217-3, ..., 217-n is the power supply voltage VDD.

If only the word line WL1 of a plurality of word lines WL1, WL2, WL3, ..., WLn is active, the voltage $V_{BLB}$ of the complementary bit line BLB is expressed as shown in the Equation 1.

$$V_{BLB} = VDD - \Delta V1 \quad (1)$$

where $\Delta V1$ shows voltage drop due to the on current Idsat. The on current Idsat flows toward the ground voltage through the transistor 219-1 and an NMOS transistor of an inverter IN1. Therefore, the amount of voltage drop $\Delta V1$ is determined by the on current Idsat.

Also, the voltage $V_{BL}$ of the bit line BL is expressed as shown in the Equation 2.

$$V_{BL} = VDD - \Delta V2 \quad (2)$$

where $\Delta V2$ shows voltage drop due to the off current Ioff. It is assumed that the amount of each off current Ioff flowing through transistors 211-2, 211-3, ..., 211-n of the second memory block 230 is all the same.

The off current flows toward the ground voltage through each of transistors 211-2, 211-3, ..., 211-n and an NMOS transistor of each inverter IN2. Therefore, the amount of $\Delta V2$ is determined by the off current Ioff. At the same time, the first memory block 210 shows an active block and the second memory block 230 shows an inactive block.

The sense amplifier driver 250 generates the sense amplifier enable signal SENSE when voltage difference VD expressed by Equation 3 is generated between the voltage $V_{BL}$ of the bit line BL and the voltage $V_{BLB}$ of the complementary bit line BLB after the word line WL1 is active.

$$VD = V_{BL} - V_{BLB} = \Delta V1 - \Delta V2 \quad (3)$$

Therefore, performance of a semiconductor device (for example, data access time) is determined by time required to generate the voltage difference VD. The voltage difference VD means margin of the semiconductor device.

In a case where a transistor is manufactured using the deep submicron technology, when threshold voltage of the transistor decreases, the on current Idsat increases and simultaneously, the off current Ioff also increases. In the high temperature and fast manufacturing process, since the off current Ioff comparatively increases larger than the on current Idsat does, the time to generate the voltage difference VD is longer. Therefore, the margin of a semiconductor device having transistors manufactured by the high temperature and fast process decreases.

Figure 3:
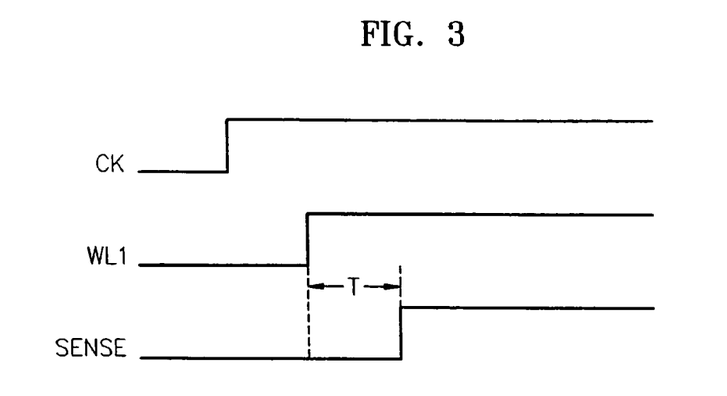
FIG. 3 is a timing diagram showing input and output waveforms of the sense amplifier driver of FIG. 2.

FIG. 3 is a timing graph showing an input/output waveform of the sense amplifier driver of FIG. 2. Referring to FIG. 3, time T shows the time required from activation of the word line WL1 to activation of the sense amplifier enable signal SENSE. The time T, which is a constant value, is determined by a manufacturer of a semiconductor device.

For example, if it is assumed that the time T required to generate the voltage difference VD of 100 mV is 100 ms, though the time required to generate the voltage difference VD of 100 mV increases to 150 ms due to an increase of the off current, the conventional sense amplifier enable signal SENSE is unconditionally active after 100 ms from activation of the word line WL1. At this time, since the sense amplifier 270 is active in a state where the voltage $V_{BL}$ of the bit line BL and the voltage $V_{BLB}$ of the complementary bit line BLB are not sufficiently evaluated, the sense amplifier 270 may not exactly detect data on the bit line BL and data on the complementary bit line BLB. Therefore, performance of the sense amplifier 270 may be lower.

Figure 4:
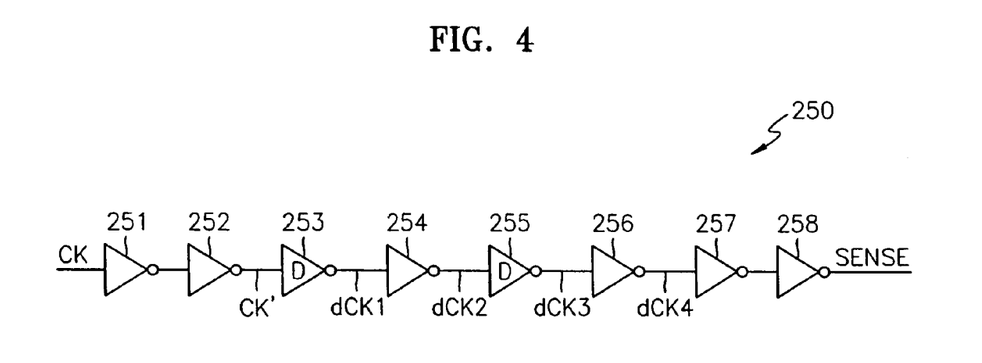
FIG. 4 is a block diagram of the sense amplifier driver of FIG. 2.

FIG. 4 is a block diagram of the sense amplifier driver of FIG. 2. Referring to FIG. 4, the sense amplifier driver 250 includes a plurality of inverters 251 through 258 connected in series and generates the sense amplifier enable signal SENSE by buffering the clock signal CK. At this time, two inverters 253, 255 delay transition time from logic high to logic low as long as predetermined time and output the delayed signals at their output ports. The delay time is determined when the inverters 253, 255 are manufactured.

Figure 5:
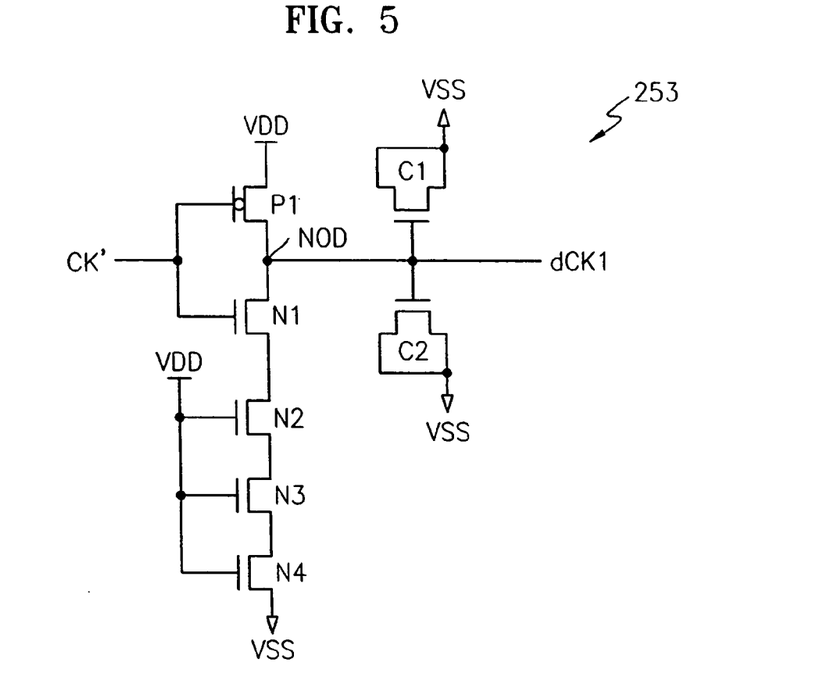
FIG. 5 is a detailed circuit diagram of an inverter of FIG. 4.

FIG. 5 is a detailed circuit diagram of each of inverters 253, 255 shown in FIG. 4. Referring to FIGS. 4 and 5, an input signal CK' is input to both gates of a PMOS transistor P1 and an NMOS transistor N1, and a plurality of transistors P1, N1, N2, N3, and N4 are connected in series between the power supply voltage VDD and the ground voltage VSS. Also, the power supply voltage VDD is input to the gates of the transistors N2, N3, and N4. Each of capacitors C1, C2 realized by an NMOS transistor is connected to the output port NOD of the inverter 253. Therefore, the transition time from logic high to logic low is determined by turn-on resistance of the NMOS transistors N2, N3, and N4 connected in series and capacitance of the capacitors C1 and C2.

Figure 6:
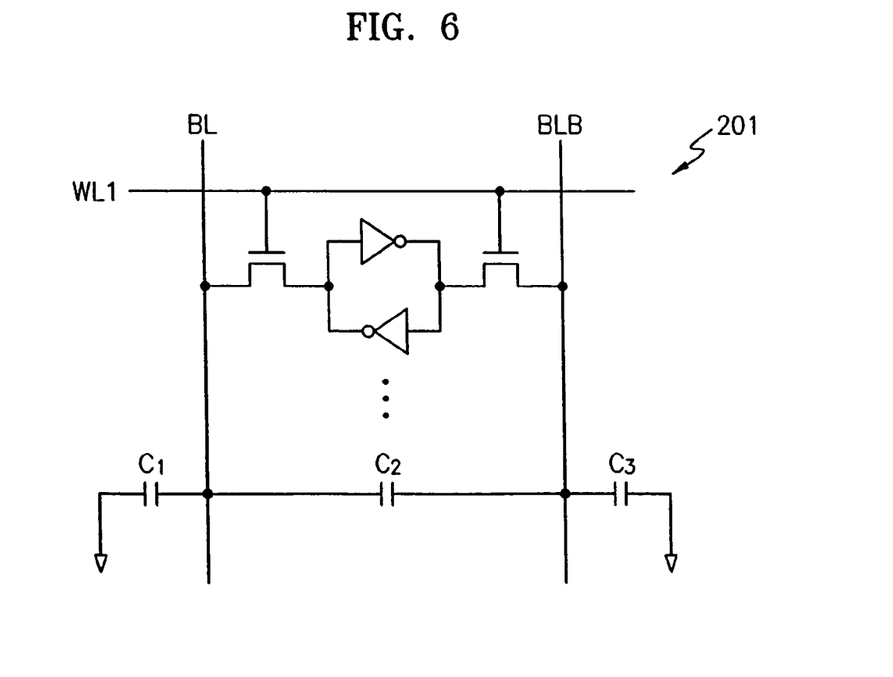
FIG. 6 is a circuit diagram reflecting coupling capacitance between a bit line and a complementary bit line of FIG. 2.

FIG. 6 is a circuit diagram reflecting coupling capacitance between the bit line and the complementary bit line, which are shown in FIG. 2.

Referring to FIG. 6, capacitance C2 is a parasitic capacitance between a bit line BL and a complementary bit line BLB, capacitance C1 is a parasitic capacitance between the bit line BL and a ground voltage, and capacitance C3 is a parasitic capacitance between the complementary bit line BLB and the ground voltage. Thus, the entire capacitance seen at the bit line BL is the sum of C1 and C2. Also, a ratio of the capacitance C2 to the entire capacitance C1+C2+C3 is a coupling ratio.

The capacitance C2 is a factor that causes the RC delay of the bit line BL like the capacitance C1 and, at the same time, affects an adjacent complementary bit line BLB. Thus, if the capacitance C2 increases, the voltage $V_{BL}$ of the bit line BL is easily affected by the voltage $V_{BLB}$ of the complementary bit line BLB.

For example, the voltage $V_{BL}$ of the bit line BL that has been precharged as the power supply voltage VDD is affected by the evaluation of the complementary bit line BLB and reduced lower than the power supply voltage VDD, the margin of the sense amplifier 270 decreases.

Figure 7:
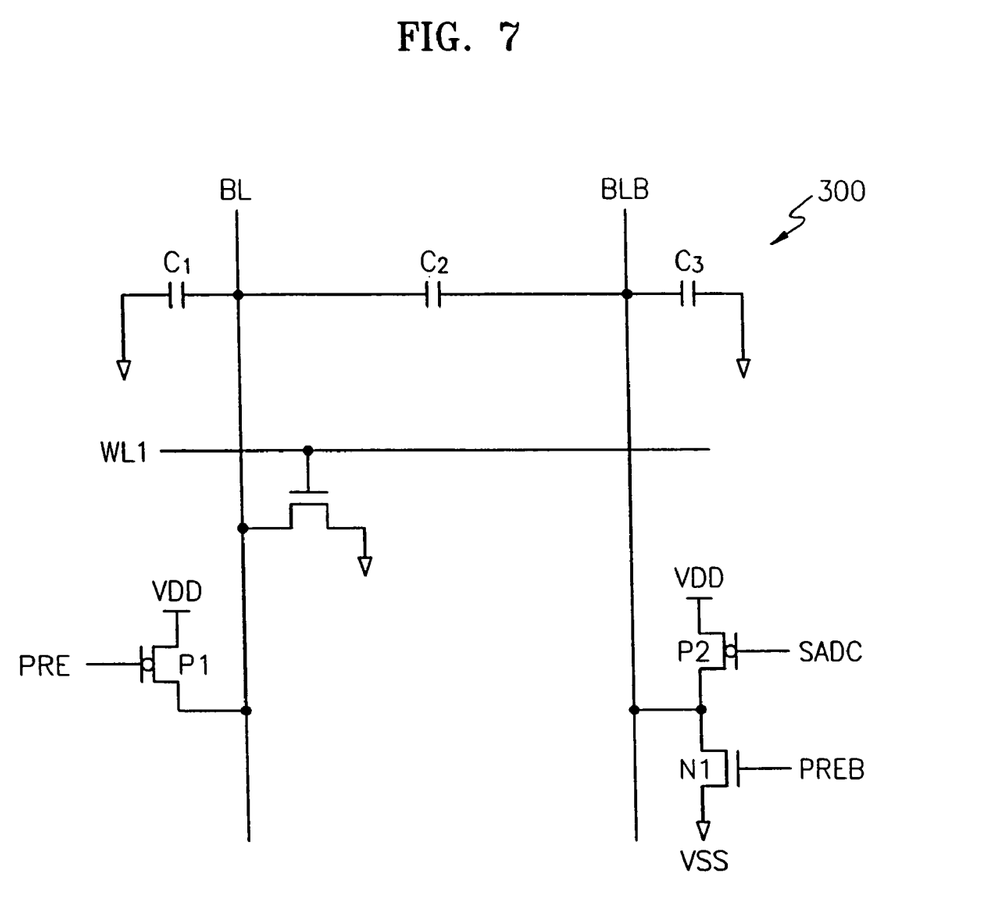
FIG. 7 is a circuit diagram to which the concept for embodying a sense amplifier driver according to an embodiment of the present invention is applied.

FIG. 7 is a circuit diagram to which the concept for embodying a sense amplifier driver according to an embodiment of the present invention is applied. FIG. 7 illustrates the concept for using the influence of the coupling capacitance as described with reference to FIG. 6 to the contrary.

A PMOS transistor P1 is connected between a power supply voltage VDD and a bit line BL. The PMOS transistor P1 precharges the voltage $V_{BL}$ of a bit line BL to the power supply voltage VDD in response a first precharge control signal PRE input to a gate of the PMOS transistor P1.

A PMOS transistor P2 is connected between the power supply voltage VDD and a complementary bit line BLB, and a control voltage SADC is input to a gate of the PMOS transistor P2. An NMOS transistor N1 is connected between the complementary bit line BLB and a ground voltage VSS, and a second precharge control signal PREB is input to a gate of the NMOS transistor N1. The first precharge control signal PRE and the second precharge control signal PREB are complementary signals.

The first precharge control signal PRE is maintained at a low level (hereinafter, referred to as a precharge step), the bit line BL is precharged to the power supply voltage VDD and the complementary bit line BL is pre-discharged to the ground voltage VSS.

While the first precharge control signal PRE makes a low-to-high transition and is maintained at a high level (hereinafter, referred to as evaluation step), if a word line WL1 is enabled high, the bit line BL of FIGS. 2 and 7 is evaluated from the power supply voltage VDD to the ground voltage VSS and, concurrently, the complementary bit line BLB is evaluated from the ground voltage VSS to a predetermined voltage according to the level of the control voltage SADC. That is, a target evaluation voltage of the complementary bit line BLB is determined by the level of the control voltage SADC.

If the control voltage SADC is 0 V, the voltage $V_{BLB}$ of the complementary bit line BLB is rapidly evaluated from 0 V to the power supply voltage VDD by the PMOS transistor P2. In this case, the evaluation of the bit line BL is strongly affected by the evaluation of the complementary bit line BLB due to a coupling effect of the coupling capacitance C2. Thus, an enabling timing of the sense amplifier enable signal SENSE shown in FIG. 2 can be controlled using the coupling effect.

If the control voltage SADC is a power supply voltage VDD, since the PMOS transistor P2 is not turned on, the voltage $V_{BLB}$ of the complementary bit line BLB is maintained to be 0 V. In this case, the evaluation of the bit line BL is hardly affected by the evaluation of the complementary bit line BLB.

Figure 8:
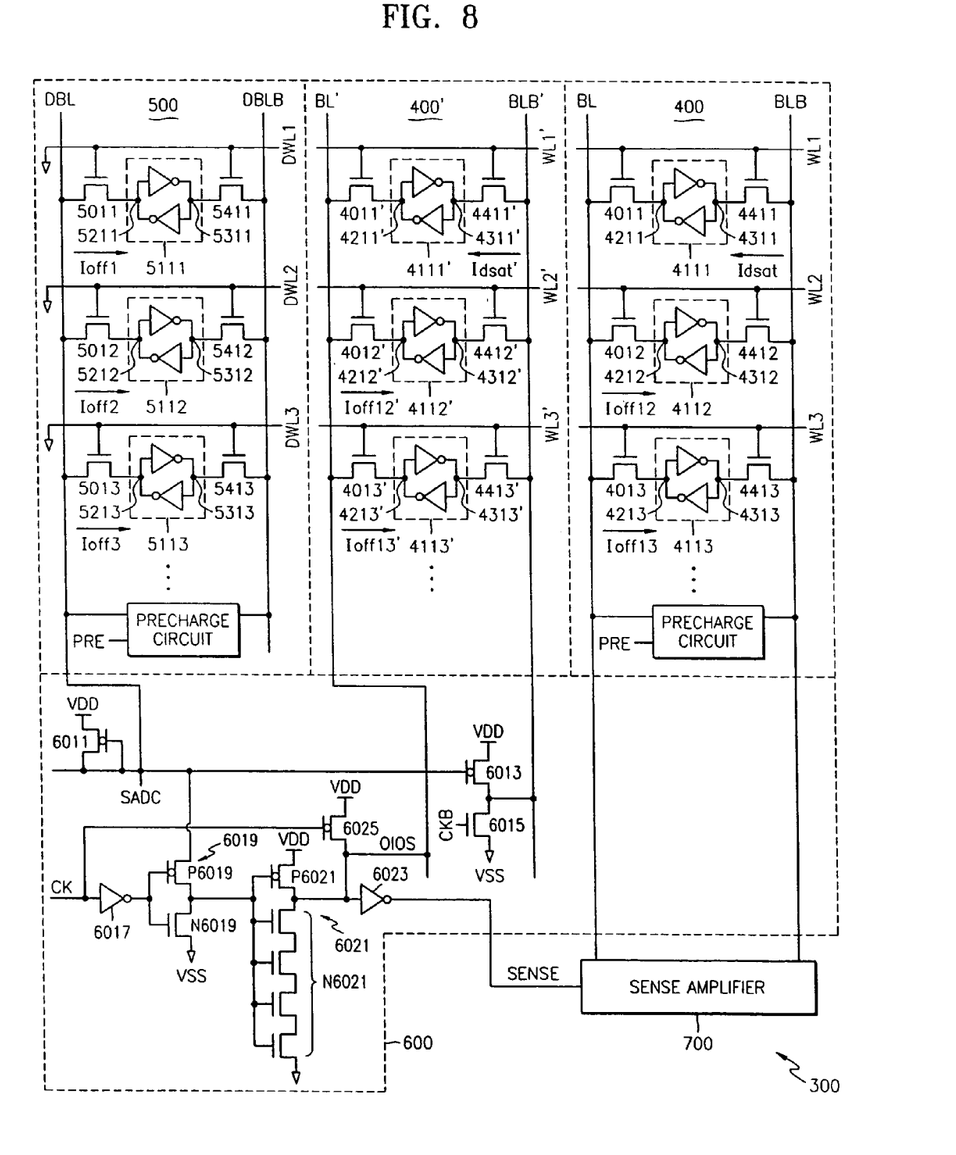
FIG. 8 is a block diagram of a semiconductor device having the sense amplifier driver according to the embodiment of the present invention.

FIG. 8 is a block diagram of a semiconductor device having a sense amplifier driver according to the embodiment of the present invention.

Referring to FIG. 8, the semiconductor device 300 comprises a memory cell array 400, a first dummy memory cell array 400', a second dummy memory cell array 500, a sense amplifier driver 600, and a sense amplifier 700.

The memory cell array 400 shown in the exemplary embodiment of FIG. 8 comprises only memory cells that are connected to one bit line BL and one complementary bit line BLB for clarity of description. Each memory cell includes one storage circuit (4111, 4112, 4113, . . . ) comprised of inverters. A precharge circuit is connected between the bit line BL and the complementary bit line BLB. Thus, the precharge circuit precharges the bit line BL and the complementary bit line BLB to a predetermined voltage, e.g., a power supply voltage VDD in a precharge step.

The voltage of nodes 4211, 4312, and 4313 is the power supply voltage VDD, and the voltage of nodes 4311, 4212, and 4213 is a ground voltage VSS. An on current Idsat flows through a transistor 4411, and off currents Ioff12 and Ioff13 flow through transistors 4012 and 4013, respectively. Only a word line WL1 is enabled.

The construction and operation of the first dummy memory cell array 400' are the same as those of the memory cell array 400 except the precharge circuit. That is, the first dummy memory cell array 400' comprises a first dummy bit line BL', a first complementary dummy bit line BLB', and a plurality of first dummy word lines (WL1', WL2', WL3', . . . ), and each memory cell includes one storage circuit (4111', 4112', 4113 . . . ) comprised of inverters.

The voltage of nodes 4211', 4312', and 4313' is a power supply voltage VDD, and the voltage of nodes 4311', 4212', 4213' is a ground voltage VSS. An on current Idsat flows through a transistor 4411', and off currents Ioff12' and Ioff13' flow through transistors 4012' and 4013', respectively. Only a word line WL1' is enabled.

As described in connection with FIG. 7, the first dummy bit line BL' is precharged to the power supply voltage VDD, and the first complementary dummy bit line BLB' is predischarged to a ground voltage in the precharge step shown in FIG. 8.

The second dummy memory cell array 500 comprises a second dummy bit line DBL, a second complementary dummy bit line DBLB, a plurality of second dummy word lines (DWL1, DWL2, DWL3, . . . ), a plurality of transistors (5011, 5012, 5013, . . . , and 5411, 5412, 5413, . . . ), and a plurality of memory cells (5111, 5112, 5113, . . . ).

Each of the second dummy word lines (DWL1, DWL2, DWL3, . . . ) is connected to the ground voltage VSS. The second dummy bit line DBL and the second complementary dummy bit line DBLB are precharged to the power supply voltage VDD in the precharge step of the semiconductor device 300.

The voltage of each of nodes (5211, 5212, 5213, . . . ) is a ground voltage VSS, the voltage of each of nodes (5311, 5312, 5313, . . . ) is a power supply voltage VDD, and off currents (Ioff1, Ioff2, Ioff3, . . . ) flow through transistors (5011, 5012, 5013, . . . ), respectively.

A gate of each of the transistors (5011, 5012, 5013, . . . ) is connected to a corresponding second dummy word line of the second dummy word lines (DWL1, DWL2, DWL3, . . . ), and each of the transistors (5011, 5012, 5013, . . . ) is connected between the second dummy bit line DBL and the corresponding node of the nodes (5211, 5212, 5213, . . . ).

The voltage SADC of the second dummy bit line DBL is determined by a voltage drop caused by the off currents (Ioff1, Ioff2, Ioff3, . . . ) that flow through the transistors (5011, 5012, 5013, . . . ), respectively. That is, the voltage SADC of the second dummy bit line DBL can be expressed as shown in Equation 4.

$$SADC = VDD - \Delta V3 \quad (4)$$

Here, $\Delta V3$ is a voltage drop caused by the sum of the off currents (Ioff1, Ioff2, Ioff3 . . . ) that flow through the transistors (5011, 5012, 5013, . . . ), respectively. The voltage drop $\Delta V3$ can be substantially the same as the voltage drop $\Delta V2$. The voltage SADC of the second dummy bit line DBL is the control voltage that controls the operation of each of the PMOS transistor P2 of FIG. 7 and the PMOS transistor 6013 of FIG. 8.

The sense amplifier driver 600 receives and buffers a clock signal CK and generates a sense amplifier enable signal SENSE. The sense amplifier enable signal SENSE enables the sense amplifier 700, an enabling point of time of the sense amplifier enable signal SENSE is determined by the voltage SADC of the second dummy bit line DBL.

The sense amplifier 600 comprises a plurality of inverters 6017, 6019, 6021, and 6023, which are connected in series, a first power supply circuit 6013, a discharge circuit 6015, a second power supply circuit 6011, and a third power supply circuit 6025.

At least a first inverter 6019 of the plurality of inverters 6017, 6019, 6021, and 6023 can swing between the ground voltage VSS and the voltage SADC of the second dummy bit line DBL. An input terminal of the second inverter 6021 is connected to an output terminal of the first inverter 6019, and an output terminal of the second inverter 6021 is connected to the first dummy bit line BL'.

The second power supply circuit is realized by a PMOS transistor 6011, and the PMOS transistor 6011 is connected between the power supply voltage (source) VDD and the second dummy bit line DBL, and a gate of the PMOS transistor 6011 is connected to the second dummy bit line DBL.

The inverter 6017 receives and inverts the clock signal CK and outputs the result to an input terminal of the inverter 6019.

A PMOS transistor P6019 of the first inverter 6019 is connected between the second dummy bit line DBL and an output terminal of the inverter 6019, and an NMOS transistor N6019 thereof is connected between the output terminal thereof and the ground voltage VSS. Thus, a pull-up level of the output terminal of the inverter 6019 is the voltage SADC of the second dummy bit line DBL.

The second inverter 6021 comprises a PMOS transistor P6021 and a group N6021 of transistors, and the group N6021 of transistors includes a plurality of NMOS transistors, which are connected in series. The PMOS transistor P6021 is connected between the power supply voltage VDD and an output terminal of the inverter 6021, and the group N6021 of transistors is connected between the output terminal of the inverter 6021 and the ground voltage VSS.

The group N6021 of transistors delays a time taken by the output signal of the inverter 6021 to make a high-to-low transition. The number of the NMOS transistors of the group N6021 can be changed according to its design specification. The output terminal of the second inverter 6021 is connected to the first dummy bit line BL'.

The third power supply circuit is realized by a PMOS transistor 6025. The PMOS transistor 6025 is connected between the power supply (source) (VDD) and the output terminal of the inverter 6021, and the clock signal CK is input to a gate of the PMOS transistor 6025. The PMOS transistor 6025 pulls up the output terminal of the inverter 6021 to the power supply voltage VDD based on a state of the clock signal CK.

A ratio of channel width to channel length of the PMOS transistor P6021 is much lower than a ratio of channel width to channel length of the PMOS transistor 6025.

The inverter 6023 receives and inverts the output signal of the inverter 6021 and generates a sense amplifier enable signal SENSE. A time taken by the output signal SENSE of the inverter 6023 to make a low-to-high transition is considerably affected by the group N6021 of transistors.

The first power supply circuit is realized by a PMOS transistor 6013. The PMOS transistor 6013 is connected between the power supply source VDD and the first complementary bit line BLB', and a gate of the PMOS transistor 6013 is connected to the second dummy bit line DBL. The discharge circuit 6015 is realized by an NMOS transistor 6015. The NMOS transistor 6015 is connected between the second complementary bit line BLB' and the ground voltage VSS, and a complementary clock signal CKB is input to a gate of the NMOS transistor 6015. The clock signal CK and the complementary clock signal CKB are complementary signals.

The sense amplifier 700 senses and amplifies a voltage difference between the bit line BL and the complementary bit line BLB in response to the sense amplifier enable signal SENSE.

Figure 9:
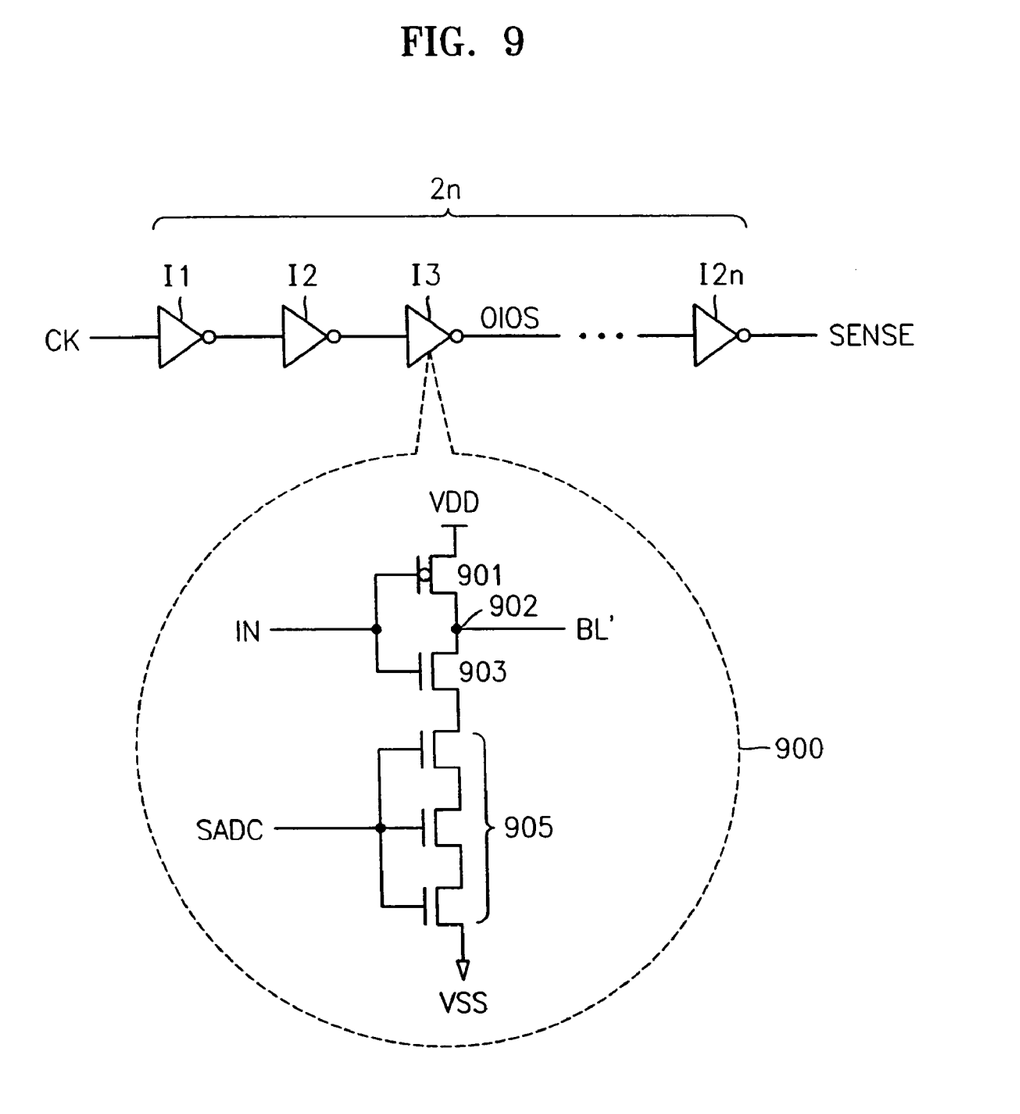
FIG. 9 is a circuit diagram of serially connected inverters, which constitute the sense amplifier driver shown in FIG. 8, according to another embodiment.

FIG. 9 is a circuit diagram of serially connected inverters, which constitute the sense amplifier driver shown in FIG. 8, according to another embodiment. Referring to FIGS. 8 and 9, 2n inverters I1, I2, I3, . . . , and I2n (n is a natural number) are connected in series.

The 2n inverters I1, I2, I3, . . . , and I2n receive a clock signal CK, buffer the clock signal CK, and output a sense amplifier driver signal SENSE. The 2n inverters I1, I2, I3, . . . , and I2n generate the sense amplifier enable signal SENSE, of which an enabling time varies according to the voltage SADC of the second dummy bit line DBL.

An output terminal 902 of at least an inverter I3 of the 2n inverters 1, I2, I3, . . . , and I2n is connected to a first dummy bit line BL', and the inverter I3 includes a pull-up circuit 901 and pull-down circuits 903 and 905.

While the pull-up circuit 901 pulls up the first dummy bit line BL' to the power supply voltage VDD in response to an input signal IN, the pull-down circuits 903 and 905 pull down the first dummy bit line BL' to a ground voltage VSS in response to the control voltage SADC and the input signal IN.

As shown in FIG. 9, the first inverter I3 comprises a PMOS transistor 901, an NMOS transistor 903, and a group N905 of transistors. The group N905 of transistors includes a plurality of NMOS transistors, which are connected in series. The PMOS transistor 901 is connected between the power supply voltage VDD and the output terminal 902 of the inverter I3, and the NMOS transistor 903 is connected to the ground voltage VSS by the group N905 of transistors. The output signal IN of the inverter I2 is input to a gate of each of the transistors 901 and 903.

The voltage SADC of the second dummy bit line DBL is input to a gate of each transistor of the group N905. The group N905 of transistors delays a time taken by the output signal of the output terminal 902 to make a high-to-low transition. The number of transistors of the group N905 can be changed according to its design specification.

Figure 10A:
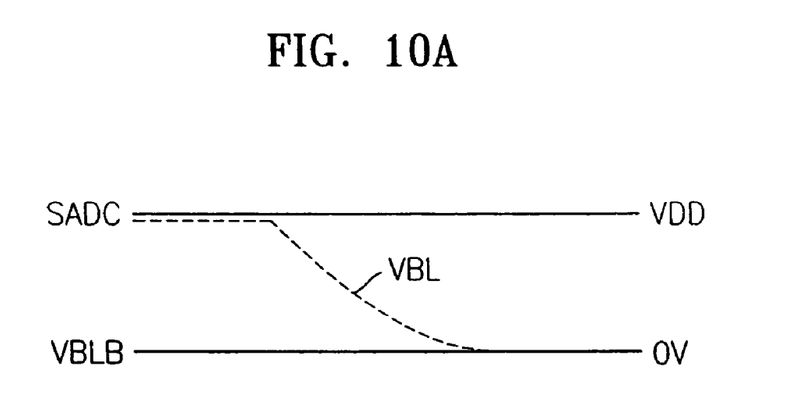
FIGS. 10A through 10C are timing diagrams showing input and output signals of the sense amplifier driver according to the embodiments of the present invention.
Figure 10B:
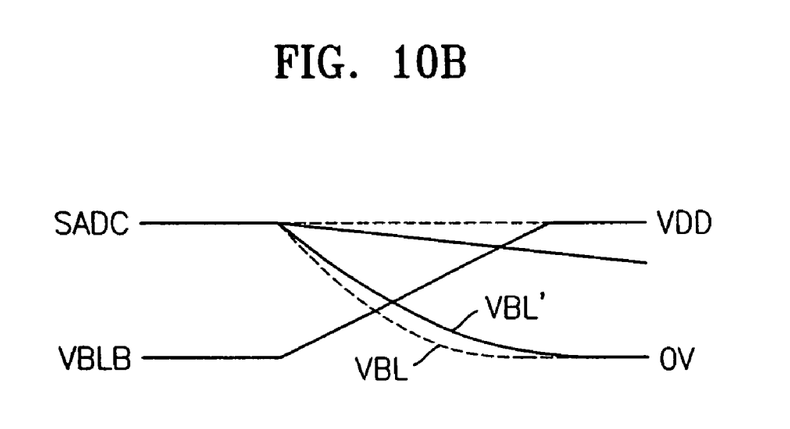
Figure 10C:
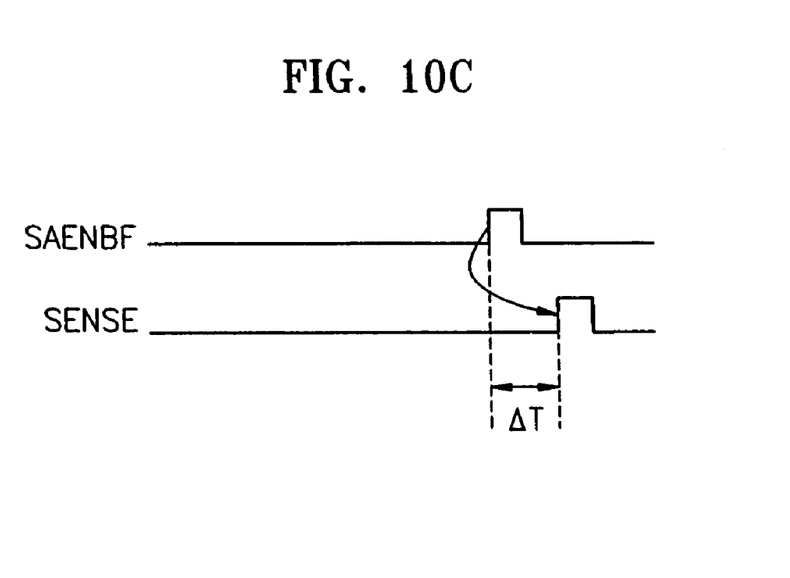

FIGS. 10A through 10C are timing diagrams showing input and output signals of the sense amplifier driver according to the embodiments of the present invention. The operation of the sense amplifier driver 600 will now be described in detail with reference to FIGS. 7 through 10.

In a precharge step, a clock signal CK is a low level. Thus, the bit line BL and the complementary bit line BLB of the memory cell array 400 are precharged to the power supply voltage VDD, the first dummy bit line BL' is precharged to the power supply voltage VDD, and the first complementary dummy bit line BLB' is pre-discharged to the ground voltage VSS. Also, the second dummy bit line DBL and the second complementary dummy bit line DBLB are precharged to the power supply voltage VDD.

FIG. 10A is a timing diagram of showing the voltage $V_{BL}$ of the first dummy bit line BL' and the voltage $V_{BLB}$ of the first complementary dummy bit line BLB' in an evaluation step of a normal state or a slow process. FIG. 10C is a timing diagram showing a sense amplifier enable signal SAENBF of a normal state and a sense amplifier enable signal SENSE in a fast process.

Since an off current is low in a low-temperature slow process, the voltage SADC of the second dummy bit line DBL is almost the same as the power supply voltage VDD. Thus, the PMOS transistor 6013 is not turned on.

Here, since the voltage $V_{BLB}$ of the second complementary dummy bit line BLB' is maintained to be 0 V, when the voltage $V_{BL}$ of the first dummy bit line BL' is evaluated from the power supply voltage VDD to 0 V, the voltage $V_{BL}$ of the first dummy bit line BL' is hardly affected by the voltage $V_{BLB}$ of the first complementary bit line BLB' and the coupling effect of the coupling capacitance C2. Thus, the voltage $V_{BL}$ of the first dummy bit line BL' is normally evaluated from the power supply voltage VDD to 0 V. Thus, the sense amplifier enable signal SENSEBF is normally generated.

FIG. 10B is a timing diagram of the voltage $V_{BL}$ of the first dummy bit line BL' and the voltage $V_{BLB}$ of the first complementary dummy bit line BLB' in an evaluation step of a high-temperature fast process.

Since the off current is considerably high in a high-temperature fast process, the voltage SADC of the second dummy bit line DBL, as shown in Equation 4, is reduced lower than the power supply voltage VDD. Thus, once the voltage SADC of the second dummy bit line DBL is lowered such that the PMOS transistor 6013 is turned on, the PMOS transistor 6013 is turned on in response to the control voltage SADC.

Thus, the voltage $V_{BLB}$ of the first complementary bit line BLB' is evaluated to the power supply voltage VDD by the PMOS transistor 6013, and the voltage $V_{BL}$ of the first complementary dummy bit line BL' that has been evaluated from the power supply voltage VDD to 0 V is considerably affected by the coupling due to the voltage $V_{BLB}$ of the first complementary dummy bit line BLB'.

Thus, a time taken by the inverter 6021 to make a high (H)-to-low (L) transition is delayed. Also, an enabling timing of the output signal SENSE of the inverter 6023 is delayed ΔT later than an enabling timing of the output signal SAENBF of the inverter 6023, which is generated in a normal state.

Thus, the sense amplifier driver 600 can control the enabling timing of the sense amplifier enable signal SENSE based on the voltage SADC of the second dummy bit line DBL. The voltage SADC of the second dummy bit line DBL is determined by the amount of off current that flows through the second dummy bit line DBL.

Thus, the sense amplifier driver 600 of the present invention can enable the sense amplifier enable signal SENSE even if a time taken to achieve a voltage difference VD of 100 mv is increased to 150 ms due to an increase in the off current that flows through the first dummy bit line BL.

As a result, after the voltage $V_{BL}$ of the first dummy bit line BL' and the voltage $V_{BLB}$ of the first complementary dummy bit line BLB' are evaluated to sufficient voltages that meet the specification, the sense amplifier 700 is enabled in response to the sense amplifier enable signal SENSE. Since the sense amplifier 700 can correctly detect data on the bit line BL and data on the complementary bit line BLB, the margin of the sense amplifier 700 increases.

As described above, the sense amplifier driver of the present invention controls an enabling timing of a sense amplifier enable signal according to the amount of off current, thus increasing the memory margin.

In the present invention, as a sense amplifier driver controls an enabling timing of a sense amplifier enable signal according to the amount of off current, the performance of a sense amplifier that is enabled in response to the sense amplifier enable signal can be improved. Thus, the present invention enhances the performance of a memory device having the sense amplifier driver.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A semiconductor device comprising:
   a sense amplifier which senses a voltage difference between a bit line and a complementary bit line;
   a dummy memory cell array which comprises a first dummy bit line and a first complementary dummy bit line;
   a second dummy bit line the voltage of which drops due to an off current; and
   a sense amplifier driver which buffers a clock signal and generates a sense amplifier enable signal for enabling the sense amplifier,
   the sense amplifier driver comprising:
   a plurality of inverters which are connected in series;
   a first power supply circuit which supplies a power supply voltage to the first complementary dummy bit line based on the voltage of the second dummy bit line; and
   a discharge circuit which discharges the first complementary dummy bit line to a ground voltage in response to a complementary clock signal,
   wherein at least a first inverter of the inverters generates a signal that swings between the voltage of the first dummy bit line and the ground voltage,
   and the second inverter inverts the output signal of the first inverter, an input terminal of the second inverter is connected to an output terminal of the first inverter, and an output terminal of the second inverter is connected to the first dummy bit line.

2. The semiconductor device of claim 1, wherein the second inverter comprises:
   a PMOS transistor which is connected between the power supply voltage and the first dummy bit line and has a gate that receives an input signal; and
   a plurality of NMOS transistors which are connected in series between the first dummy bit line and the ground voltage,
   wherein the input signal is input to a gate of each of the NMOS transistors.

3. The semiconductor device of claim 1, further comprising a second power supply voltage which is connected between the power supply voltage and the second dummy bit line and supplies the power supply voltage to the second dummy bit line based on the voltage of the second dummy bit line.

4. The semiconductor device of claim 1, further comprising:
   a third inverter which inverts the clock signal and outputs the result to an input terminal of the first inverter; and
   a third power supply circuit which supplies the power supply voltage to the output terminal of the second inverter in response to the clock signal.

5. A semiconductor device comprising:
   a sense amplifier which senses a voltage difference between a bit line and a complementary bit line;
   a dummy memory cell array which comprises a first dummy bit line and a first complementary dummy bit line;
   a second dummy bit line the voltage of which drops due to an off current; and
   a sense amplifier driver which buffers a clock signal and generates a sense amplifier enable signal for enabling the sense amplifier,
   the sense amplifier driver comprising:
   a plurality of inverters which are connected in series;
   a first power supply circuit which supplies a power supply voltage to the first complementary dummy bit line based on the voltage of the second dummy bit line; and
   a discharge circuit which discharges the second complementary dummy bit line to a ground voltage in response to a complementary clock signal,
   wherein an output terminal of at least first inverter of the inverters is connected to the first dummy bit line,
   and the first inverter comprises a pull-up circuit which pulls up the first dummy bit line to the power supply voltage based on an input signal; and a pull-down circuit which pulls down the first dummy bit line to the ground voltage based on the input signal and the voltage of the second dummy bit line.

6. The semiconductor device of claim 5, wherein the first inverter comprises:
   a PMOS transistor which is connected between the power supply voltage and the output terminal of the first inverter and has a gate that receives the input signal;
   an NMOS transistor which has a drain connected to the output terminal of the first inverter and a gate that receives the input signal; and
   a plurality of other NMOS transistors which are connected in series between a source of the NMOS transistor and the ground voltage,
   wherein a gate of each of the plurality of other NMOS transistors is connected to the second dummy bit line.

7. The semiconductor device of claim 5, further comprising a second power supply voltage which is connected between the power supply voltage and the second dummy bit line and supplies the power supply voltage to the second dummy bit line based on the voltage of the second dummy bit line.

8. The semiconductor device of claim 5, wherein the first dummy bit line and the second dummy bit line are located in different memory cell arrays.

9. A method of generating a sense amplifier enable signal for enabling a sense amplifier, the method comprising:

preharging a first dummy bit line and a second dummy bit line to a power supply voltage, and precharging a first complementary dummy bit line to a ground voltage; and evaluating the first complementary dummy bit line from the ground voltage to the power supply voltage and, concurrently, evaluating the first dummy bit line from the power supply voltage to the ground voltage, based on the voltage of the second dummy bit line of which voltage drops due to an off current.

10. The method of claim 9, wherein a time taken to evaluate the first dummy bit line from the power supply voltage to the ground voltage is determined by the voltage of the second dummy bit line.

* * * * *